(12) United States Patent
Gary et al.

(10) Patent No.: US 9,472,695 B2
(45) Date of Patent: Oct. 18, 2016

(54) OPTO-COUPLER AND METHOD OF MANUFACTURING THE SAME

(75) Inventors: Tay Thiam Siew Gary, Singapore (SG); Premkumar Jeromerajan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1187 days.

(21) Appl. No.: 13/450,279

(22) Filed: Apr. 18, 2012

(65) Prior Publication Data

US 2013/0279842 A1 Oct. 24, 2013

(51) Int. Cl.
*G02B 6/12* (2006.01)
*H01L 31/0232* (2014.01)
*H04B 10/80* (2013.01)
*H01L 31/173* (2006.01)

(52) U.S. Cl.
CPC ....... *H01L 31/02327* (2013.01); *H01L 31/173* (2013.01); *H04B 10/802* (2013.01); *H01L 2224/32145* (2013.01); *H01L 2224/48247* (2013.01); *H01L 2224/48465* (2013.01); *H01L 2224/73265* (2013.01); *H01L 2924/181* (2013.01)

(58) Field of Classification Search
CPC .......... H01L 31/02327; H01L 31/173; H04B 10/802
USPC .......................................................... 385/14
See application file for complete search history.

(56) References Cited

U.S. PATENT DOCUMENTS

| | | | |
|---|---|---|---|
| 4,284,898 A * | 8/1981 | Felkel et al. .................. | 250/551 |
| 7,412,137 B2 | 8/2008 | Suzuki et al. | |
| 7,835,410 B2 | 11/2010 | Guenter et al. | |
| 2005/0208701 A1* | 9/2005 | Jeong .................. | H01L 21/6835 438/106 |
| 2006/0067607 A1* | 3/2006 | Fang et al. ...................... | 385/14 |
| 2008/0123198 A1* | 5/2008 | Fujita ............................ | 359/709 |
| 2009/0016678 A1* | 1/2009 | Kawamura et al. ............ | 385/33 |
| 2009/0059987 A1 | 3/2009 | Walker et al. | |
| 2012/0064827 A1* | 3/2012 | Kim ...................... | H01L 23/645 455/41.1 |
| 2012/0155803 A1* | 6/2012 | Benjamin et al. ............. | 385/33 |

FOREIGN PATENT DOCUMENTS

CN 201699682 U 1/2011

* cited by examiner

Primary Examiner — Jerry Blevins

(57) ABSTRACT

A semiconductor device and methods of manufacturing the same are disclosed. Specifically, methods and devices for manufacturing opto-couplers are disclosed. Even more specifically, the opto-coupler includes a lens assembly to enhance light coupling efficiency between an optical transmitter and an optical receiver. An encapsulant material may also be utilized.

20 Claims, 5 Drawing Sheets

500

502 — PROVIDING A PLURALITY OF CONDUCTORS CONNECTED THROUGH A LEAD FRAME

504 — ATTACHING AN OPTICAL TRANSMITTER OR RECEIVER DIE

506 — PROVIDING AN ADHESIVE LAYER AND/OR DIELECTRIC LAYER

508 — ATTACHING A LENS OR PLURALITY OF LENS

510 — PROVIDING AN ADHESIVE LAYER AND/OR DIELECTRIC LAYER

512 — ATTACHING AN OPTICAL TRANSMITTER OR RECEIVER DIE

FIG. 5

OPTO-COUPLER AND METHOD OF MANUFACTURING THE SAME

FIELD OF THE DISCLOSURE

The present disclosure is generally directed toward opto-couplers and methods for manufacturing the same.

BACKGROUND

In electronics, an opto-coupler, also called an opto-isolator, photocoupler, or optical isolator, is an electronic device designed to transfer electrical signals by utilizing light waves to provide coupling with electrical isolation between its input and output. The main purpose of an opto-coupler is to prevent high voltages or rapidly changing voltages on one side of the circuit from damaging components or distorting transmissions on the other side.

Currently, an opto-coupler includes a source (emitter) of light, usually a near infrared light-emitting diode (LED), that converts an electrical input signal into light, a closed optical channel (also called dielectrical channel), and a photosensor, which detects incoming light and either generates electric energy directly, or modulates electric current flowing from an external power supply. The photosensor can be a photo-resistor, a photodiode, a phototransistor, a silicon-controlled rectifier (SCR) or a triac. Because LEDs can sense light in addition to emitting it, construction of symmetrical, bi-directional opto-couplers are possible.

It would be desirable to improve opto-couplers by minimizing the current footprint, inefficiencies with current opto-couplers and to provide easy and economical manufacturing techniques.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings:

FIG. 5 illustrates a flow diagram of method steps for manufacturing an opto-coupler according to another embodiment of the disclosure.

DETAILED DESCRIPTION

Figure 1:
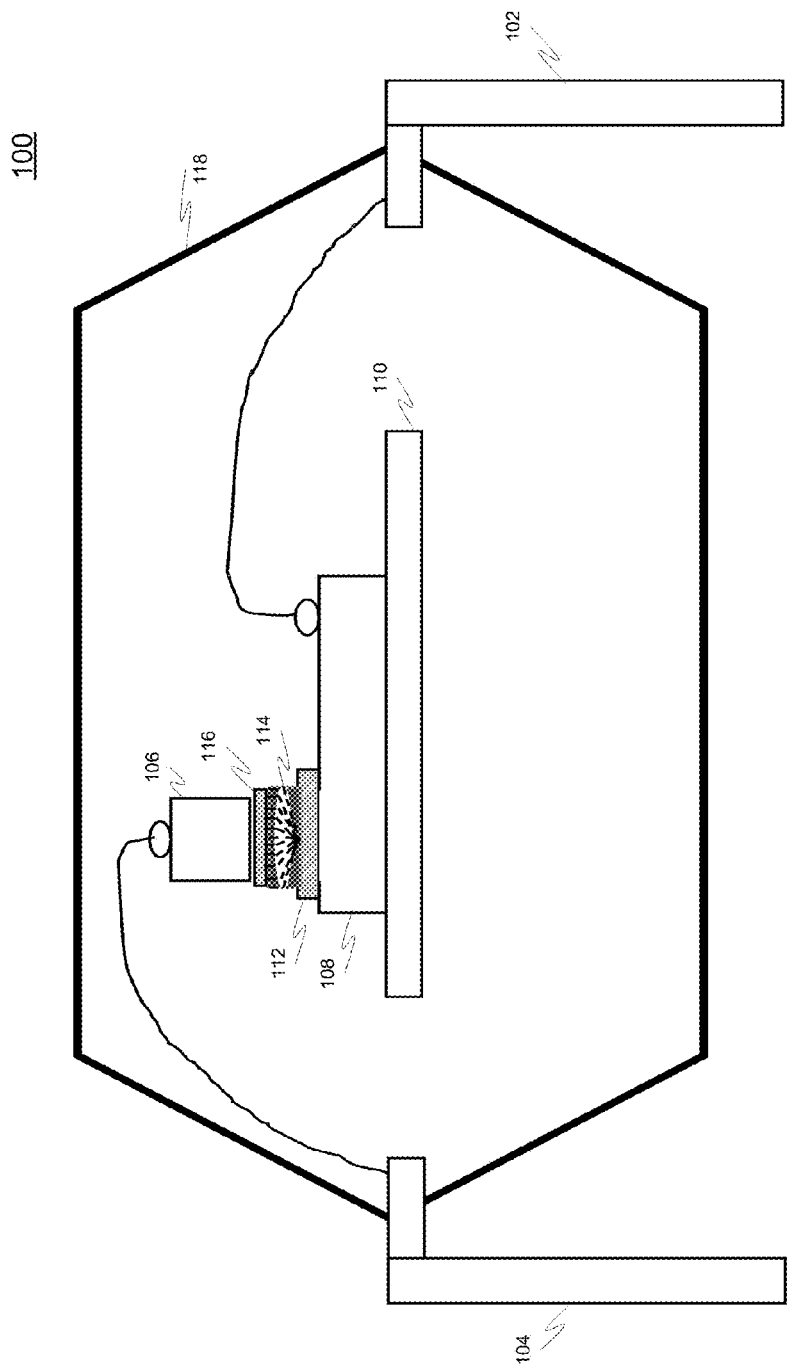
FIG. 1 illustrates a cross-sectional view of an opto-coupler and a lead frame in accordance with an embodiment of the disclosure.

An embodiment of the disclosure is directed towards an opto-coupler with a lens assembly. The lens assembly is configured to focus light emitted from an optical transmitter to an optical receiver. The lens may be sandwiched or otherwise positioned between various dielectric materials and/or adhesive materials. This configuration allows for a compact design and/or improves a multichannel layout. Moreover, the lens may be configured to enhance coupling performances, thereby minimizing the need for a high power optical transmitter, and reduce Bill of Material (BOM) costs by enabling multi-channel configurations among other advantages.

In another embodiment, an opto-coupler includes a substrate, optical receiver, a lens and an optical transmitter. The lens is arranged between a first dielectric material and second dielectric material. An adhesive material may be used with the first and second dielectric material. For example, the adhesive may be used on each side of the first and second dielectric material or on one side of the dielectric material. In addition, the adhesive may be used on each side of the lens, substrate, optical transmitter and receiver. The adhesive material may include a transparent material, e.g., epoxy securing layers, tape or combinations of the same. Optionally, a dielectric material may not be used and only an adhesive material used. For example, the adhesive material may be used on one or both sides of the lens.

The lens may include a lens structure having a plurality of lenses, e.g., two or more lenses being aligned in one or more planes. In some embodiments, the focal length of the lens is selected so as to focus light from the optical transmitter at a receiving surface of the optical receiver. The lens or lens structure may include a single entity or multiple components. In addition, the lens may be used with LEDs of different wavelengths. The lens allows for use of reduced power LEDs, e.g., small LEDs with low light output power. Moreover, the lens permits efficient coupling performance between the optical transmitter and optical receiver because the lens causes a higher ratio of light emitted by the optical transmitter to be focused on detecting surface areas of the optical receiver.

The optical transmitter, which may also be referred to as an optical transmitter die, may include a back-emitting LED, low light output LEDs, flip-chip LEDs, etc. The optical transmitter die may also be any light source or collection of light sources capable of emitting light, e.g., an integrated circuit with an embedded LED and driver circuit. Depending on the design requirements, control circuitry may be integrated into the optical transmitter die. The optical transmitter die may be configured to be powered by a first power supply that can be internal or external to the opto-coupler. The optical transmitter die may be operable to emit light in accordance with a logic signal from an external circuit.

The optical receiver, which may also be referred to as an optical receiver die, may include a photo-diode, photo-transistor, combinations of the same and the like. The optical receiver die may be an integrated circuit with an embedded photo-detector, or alternatively, an amplifier circuit to amplify photocurrent generated by the photo-detector. Depending on the design requirements, control circuitry may be integrated into the optical receiver die to provide signal processing. The optical receiver die may be configured to be powered by a second power supply through the conductor. The optical receiver die may be operable to receive a signal in the form of light emitted from the optical transmitter die.

The first and second dielectric material may include a single material or combination of materials to achieve a high dielectric (e.g., between approximately 20 and 25 KV/mm). The first and second dielectric material may include the same materials or different materials. Moreover, the thickness of each the first and second dielectric materials may be anywhere between about 2, 3, 4, 5, and 6 mil depending upon the design requirements of the opto-coupler. The thickness of each of these materials is used to increase isolation thickness between the optical die and receiver die, thereby embodiments of the disclosure can improve high voltage performance for opto-couplers configured to operate between approximately 2,500 V and 5,000 V. In some embodiments, opto-couplers can be designed to operate at greater than 5,000 V. The substrate may include an integrated circuit, printed circuit board (flexible or rigid), glass, plastic, and/or combinations of the same.

Optionally, an encapsulant material may be used with the opto-coupler, e.g., the encapsulant configured to cover at least a portion of the opto-coupler. The encapsulant material may include an optically-transparent silicone material that is configured to transmit light as well as physically protect the semiconductor device, wires, etc. from physical impacts, shock, vibration, and the like. Other suitable types of encapsulant materials include, without limitation, epoxy, silicone, a hybrid of silicone and epoxy, phosphor, a hybrid of phosphor and silicone, an amorphous polyamide resin or fluorocarbon, glass, plastic, or combinations thereof.

As used herein, the term "on" should not be narrowly construed as relating to a vertical relationship of layers or components. Rather, embodiments of the present disclosure contemplate that one component may be "on" another component or one layer may be "on" another layer when it is next to, adjacent, abutting, underneath, etc. Specifically, a first component may be "on" a second component even though the first component is below the second component (e.g., in flip-chip technology) since the first component would be "on" the second component if both components were simultaneously turned over or viewed with a different point of reference. As another example, a first component may be considered to be "on" a second component if the first component is to the left or right of a second component again because the first and second components can be turned or viewed with a different point of reference. The term "on" is not limited to physical relationships of objects under the force of gravity.

Moreover, the term "on" is considered to include both direct and indirect contact. For example, a stack of three materials with a first material on the bottom and a second material sandwiched between the first and third materials may be considered to have the third material directly on the second material and may also be considered to have the third material indirectly on the first material.

Reference will now be made in detail to an embodiment of the present disclosure, example of which is illustrated in the accompanying drawings.

FIG. 1 illustrates a cross-sectional view of an opto-coupler in a lead frame in accordance with an embodiment of the disclosure.

Referring to FIG. 1, an opto-coupler in a lead frame package is generally depicted as reference number 100. The opto-coupler 100 includes a plurality of conductors 102 and 104 (also referred to as leads), an optical transmitter die 106 and an optical receiver die 108. The plurality of conductors 102, 104 include a conductive material and may be formed from a lead frame. The plurality of conductors 102, 104 may be known as leads or conductive traces. One of the conductors 102, 104 may be extended to form a conductive pad 110 or plurality of conductive pads. Thereby, the conductive pad is configured to mechanically support an optical transmitter die 106 and/or receiver die 108. The plurality of conductors 102, 104 may be configured to connect optical transmitter die 106 and/or receiver die 108 to external circuitry of a PCB. In particular, although not shown in cross-section, the conductive pad 110 may be part of the first conductor 102 or second conductor 104.

In some embodiments, the optical receiver 108 is arranged on a conductive pad 110. A combination of an adhesive material and insulating material 112 can be arranged on die 108 (e.g., opposite the conductive pad 110). A lens or plurality of lenses 114 (e.g., a lens assembly) is arranged on the combination of adhesive material and insulating material 112. The lens assembly 114 is configured to focus light from the optical transmitter die 106 into the receiver die 108. The lens assembly 114 could include a single entity or multiple light-directing components. In particular, the light-directing components that may be provided as part of the lens assembly 114 include, without limitation, a single lens, two or more lenses that are optically stacked in parallel, or two or more lenses that are optically stacked in series. Where the lens assembly 114 comprises two or more lenses, the individual lenses in the lens assembly 114 need not necessarily be of the same type or have the same focusing properties, although this design can also be supported. The lens or multiple lenses in the lens assembly 114 may include one or more of a bi-convex lens, a plano-convex lens, a positive meniscus lens, a negative meniscus lens, a plano-concave lens, and a bi-concave lens. It should also be appreciated that other light-directing and light-manipulating components (e.g., reflectors, refractors, polarizers, beam splitters, filters, etc.) other than lenses can be employed as part of the lens assembly 114.

In embodiments where the lens assembly 114 comprises multiple lenses, the lenses may have any number of relative orientations. As one example, two or more lenses may be optically stacked in series so that a first lens first receives light from the optical transmitter 106. The first lens focuses the light received from the optical transmitter into first focused light. The first focused light may then be received at the second lens and the second lens focuses the first focused light into second focused light. The second focused light may then be transmitted to the optical receiver 108. As another example, two or more lenses may be optically stacked in parallel so that first and second lenses receive light from the optical transmitter 106 at substantially the same time and focus the received light toward the optical receiver 108. The two or more lenses that are optically stacked in parallel may be configured to focus light to a common area on the receiving surface of the optical receiver 108 or they may be configured to focus light to different areas on the receiving surface of the optical receiver 108.

In the example depicted in FIG. 1, a combination of an adhesive material and insulating material 116 are arranged on lens assembly 114. An optical transmitter die 106 is arranged on the combination of an adhesive material and insulating material 116. An encapsulant 118 covers at least a portion of the opto-coupler 100.

Figure 2:
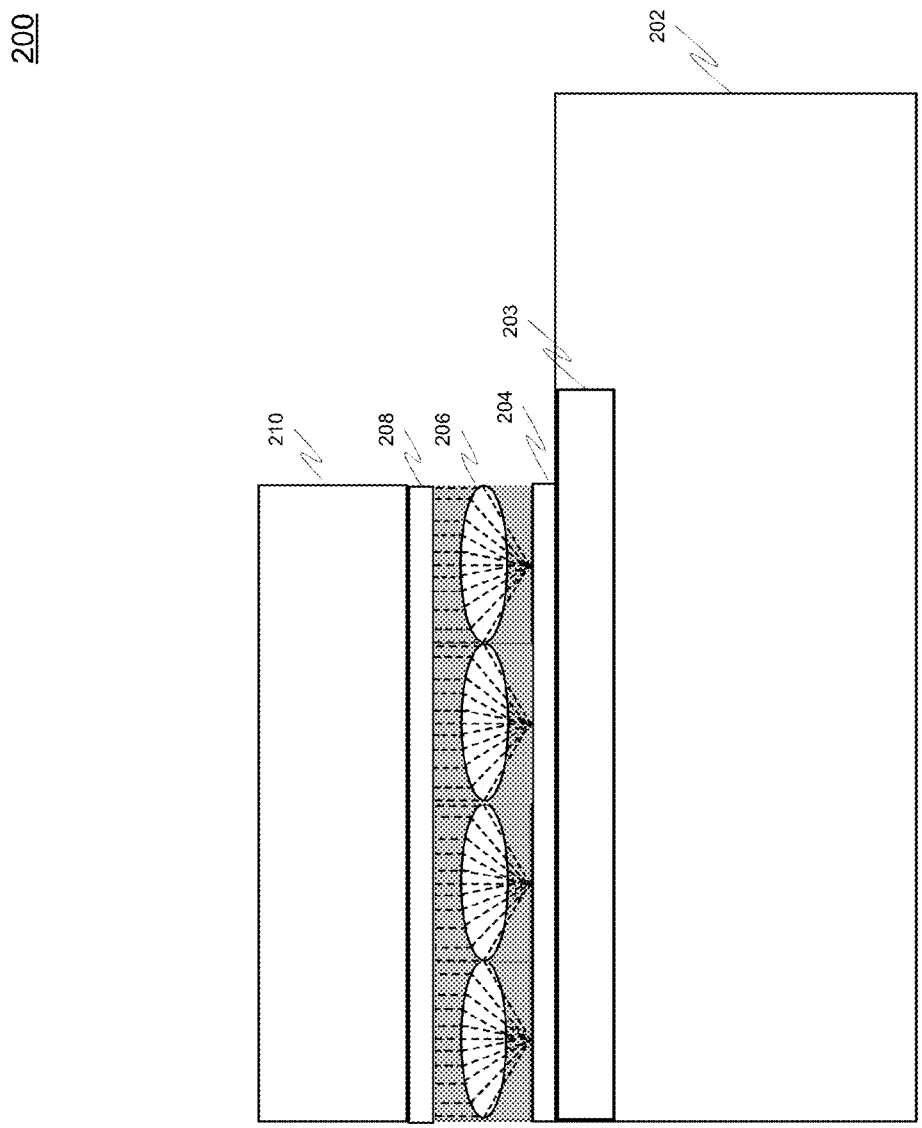
FIG. 2 illustrates a cross-sectional view of an opto-coupler according to another embodiment of the disclosure.

Referring to FIG. 2, the opto-coupler is generally depicted as reference number 200. The opto-coupler 200 includes an optical receiver die 202 including a photo detector 203, an adhesive layer 204, a plurality of lenses 206 (e.g., a lens assembly), an adhesive layer 208, and an optical transmitter die 210.

This particular example depicts the plurality of lenses 206 to include four discrete lenses that are optically stacked in parallel. Each of the plurality of lenses 206 comprise the ability to focus light received from the optical transmitter die 210 toward different locations on the receiving surface of the photo detector 203. The example of FIG. 2 also shows that each of the plurality of lenses 206 comprise substantially the same shape and, therefore, focus light in substantially similar manners. More particularly, each of the plurality of lenses 206 are bi-convex with substantially the same focal length.

The focal length of each of the plurality of lenses 206 is substantially equal to the distance from the center of one of the lenses to either the nearest surface of the adhesive layer 204 or the light receiving surface of the photo detector 203.

In some embodiments, the photo detector 203 may correspond to an array of photo detectors and each of the photo detectors in the array of photo detectors may be positioned at the focal points of each of the different lenses in the plurality of lenses 206.

Although FIG. 2 shows each of the plurality of lenses 206 comprising substantially the same optical properties (e.g., focal length, surface curvatures, etc.), it should be appreciated that such an arrangement is not necessarily required. Rather, it may be suitable to employ a plurality of lenses 206 that have different optical properties, but focus light toward a common area on the light receiving surface of the photo detector 203. Further still, it may be suitable to employ a plurality of lenses 206 that are divided into groups where a first group of lenses in the plurality of lenses 206 focus light toward a first common focal point and a second group of lenses in the plurality of lenses 206 focus light toward a second common focal point that is different from the first common focal point.

The thickness of the plurality of lenses 206 (e.g., the lens assembly) or more specifically, the distance between adhesive layers 204, 208 may vary anywhere between 5 mil and 20 mil, and particularly between 5 mil and 10 mil. Moreover, the thickness of the plurality of lenses 206 may depend upon the thickness and optical properties of the adhesive layers 204, 208. More specifically, the adhesive layers 204, 208 and the plurality of lenses 206 may be viewed as a light-manipulating assembly since the adhesive layers 204, 208 may impact the path that light travels in addition to the plurality of lenses 206 impacting the path that light travels. Accordingly, the thickness of each of the adhesive layers 204, 208 and the properties of the plurality of lenses 206 (e.g., thickness, focal length, shape, etc.) may depend upon whether and to what extent light is refracted, reflected, focused, etc. by the adhesive layers 204, 208.

Figure 3:
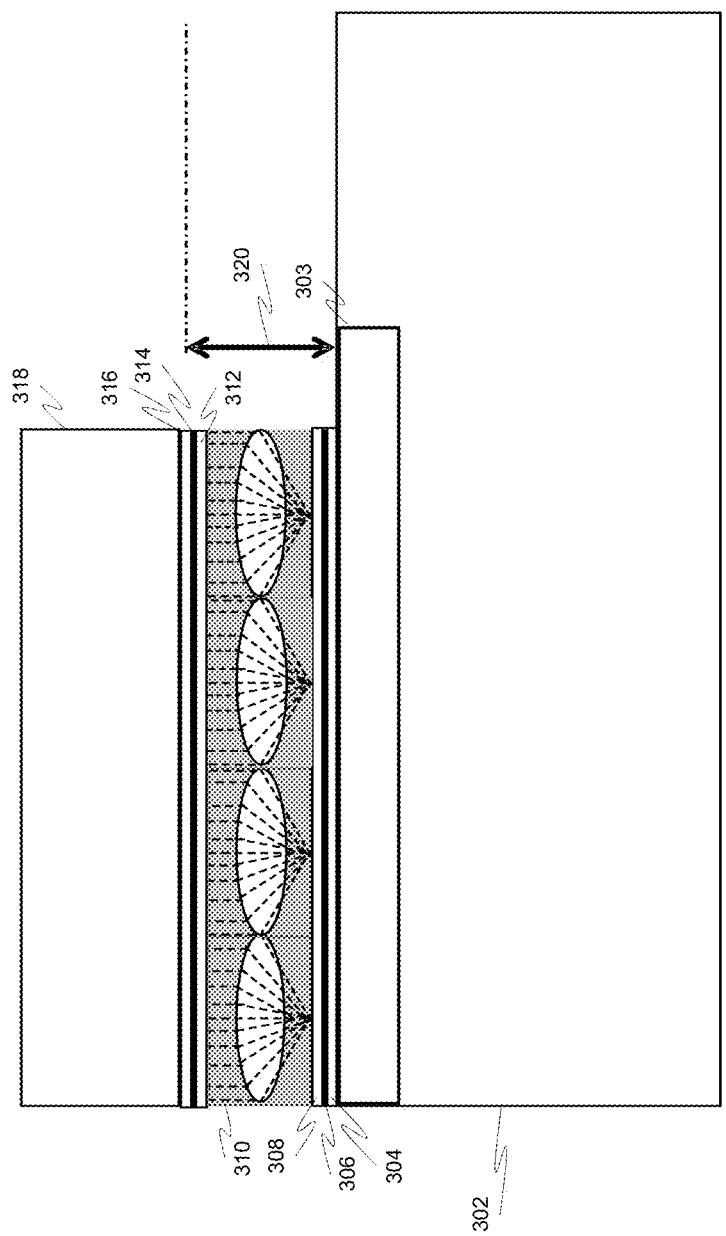
FIG. 3 illustrates a cross-sectional view of an opto-coupler according to another embodiment of the disclosure.

Referring to FIG. 3, the opto-coupler is generally depicted as reference number 300. The opto-coupler 300 includes an optical receiver die 302 with a photo detector 303, a transparent adhesive layer 304, a first dielectric layer 306, and a transparent adhesive layer 308. In this embodiment, the transparent adhesive layer 304 and 308 sandwich the first dielectric layer 306. A plurality of lenses 310 are arranged on the transparent adhesive layer 308. The plurality of lenses 310 may be similar or identical to the plurality of lenses 206 and may also be referred to as a lens assembly.

A transparent adhesive layer 312, a second dielectric layer 314, and a transparent adhesive layer 316 are arranged on the plurality of lenses 310. In this embodiment, the transparent adhesive layers 312 and 316 sandwich the second dielectric layer 314. An optical transmitter die 318 is arranged on the transparent adhesive layer 316.

A creepage distance 320 is shown between the optical transmitter die 318 and receiver die 302. This creepage distance 320 is adjustable to affect high voltage performance. That is, if a greater creepage distance 320 is achieved, the opto-coupler can be capable of supporting higher voltage differences between the high voltage (e.g., voltage at one lead) and low voltage side (e.g., voltage at the opposite lead).

Figure 4:
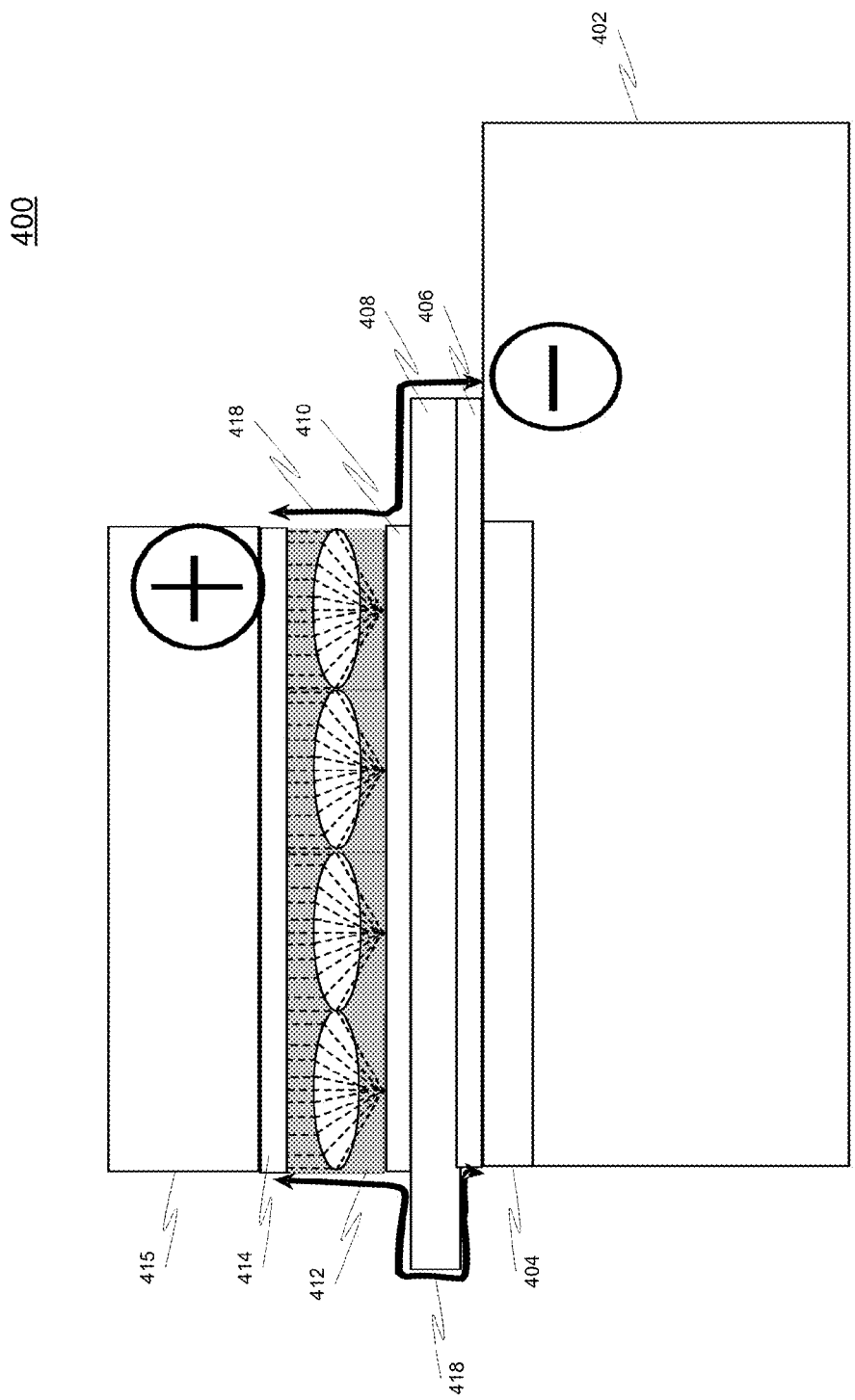
FIG. 4 illustrates a cross-sectional view of an opto-coupler according to another embodiment of the disclosure.

Referring to FIG. 4, the opto-coupler is generally depicted as reference number 400. The opto-coupler 400 includes an optical receiver die 402 including a photo detector 404, a transparent adhesive layer 406, a dielectric layer 408, and a transparent adhesive layer 410. In this embodiment, the transparent adhesive layers 406 and 410 sandwich the dielectric layer 408.

A plurality of lenses 412 are arranged on or adjacent to the transparent adhesive layer 410. The plurality of lenses 412 may be similar or identical to the plurality of lenses 206 or any other lens assembly described herein. A transparent adhesive layer 414 is also shown to be arranged on the plurality of lenses 412. An optical transmitter die 415 is arranged on the transparent adhesive layer 414.

In addition, the dielectric layer 408 and transparent adhesive layer 406 extend beyond the photo detector 404, thereby increasing a creepage distance 418. The increased creepage distance 418, as discussed above, can result in the opto-coupler supporting higher voltages between the high-voltage side and low-voltage side (e.g., between the optical transmitter die 415 and optical receiver die 402.

As can be seen the dielectric layer 408 may extend beyond photo detector 404 in all dimensions. The dielectric layer 408 may also extend beyond transparent adhesive layer 406 to increase the creepage distance 418 uniformly.

Referring to FIG. 5, the flow chart 500 illustrating a possible manufacturing process of an opto-coupler is provided. In step 502, a plurality of conductors is provided. The plurality of conductors may be in a form of leads of a lead frame. In step 504, an optical transmitter die or an optical receiver die may be attached to one or more of the conductors of the lead frame. For example, an adhesive material may be used to attach the optical transmitter die or optical receiver die to a conductor.

The method 500 may then proceed to step 506, in which the optical transmitter or receiver dies is attached to an adhesive material and/or dielectric layer. Optionally, a dielectric material and adhesive material are applied in step 506 by sandwiching a dielectric material between two adhesive layers. However, an adhesive layer may only be used without a dielectric material.

In step 508, a plurality of lens is attached with an adhesive layer of step 506. The plurality of lens may include only one lens, multiple lens or multiple lens components.

The method 500 may then proceed to steps 510 and 512, in which the optical transmitter or receiver dies is attached to an adhesive material and/or dielectric layer. Optionally, a dielectric material and adhesive material are applied in step 510 by sandwiching a dielectric material between two adhesive layers. However, an adhesive layer may only be used without a dielectric material.

Optionally, the method may further include providing an encapsulant, e.g., a transparent encapsulant is provided in liquid form. That is, it is injected into the cavity of the light guide defining element to encapsulate the optical transmitter and receiver dies. The transparent encapsulant may also encapsulate and protect all the bond wires bonding the dies to the conductors. The encapsulated opto-coupler may then be molded with a black plastic outer mold to prevent light escaping from the opto-coupler's optical channel.

The disclosures and methods described herein can be viewed as a whole, or as a number of separate disclosures that can be used independently or mixed and matched as desired. All disclosures, steps, processes, devices and methods described herein can be mixed and matched as desired. All previously described features, functions, or disclosures described herein or by reference may be mixed and matched as desired.

It will be apparent to those skilled in the art that various modifications and variations can be made in the present disclosure without departing from the spirit or scope of the disclosure. Thus, it is intended that the present disclosure cover all of the modifications and variations of this disclosure provided they come within the scope of the appended claims and their equivalents.

What is claimed:

1. An optical isolation device, comprising:
   a substrate;
   an optical receiver arranged on the substrate and connected to a first set of electrical leads operating at a first voltage, wherein the optical receiver comprises an optical receiver die with a photodetector provided thereon;
   a first dielectric layer arranged on the optical receiver;
   a lens assembly arranged on the first dielectric layer;
   a second dielectric layer arranged on the lens assembly; and
   an optical transmitter arranged on the second dielectric layer and connected to a second set of electrical leads operating at a second voltage that is different from the first voltage, wherein the first dielectric layer and a first adhesive layer extend beyond an area of the photodetector thereby increasing a creepage distance between the first set of electrical leads and the second set of electrical leads.

2. The optical isolation device of claim 1, wherein the lens assembly includes at least one of a glass material, an epoxy material, and a polymer material.

3. The optical isolation device of claim 2, wherein the lens assembly comprises at least two lenses.

4. The optical isolation device of claim 1, wherein the substrate comprises an integrated circuit and wherein the first voltage differs from the second voltage by at least 2.5 kV.

5. The optical isolation device of claim 1, wherein the first dielectric layer comprises a thickness between 2 mil and 6 mil.

6. The optical isolation device of claim 1, wherein the first dielectric layer and the second dielectric layer are both no thicker than 6 mil.

7. The optical isolation device of claim 1, wherein the adhesive layer is arranged on at least one side of the first dielectric layer and second dielectric layer.

8. The optical isolation device of claim 1, wherein the adhesive layer comprises a tape.

9. An opto-coupler, comprising:
   a substrate;
   an optical receiver arranged on the substrate;
   a first adhesive material of substantially uniform thickness;
   a first dielectric layer sandwiched between the optical receiver and the first adhesive,
   a lens assembly arranged on the first adhesive material;
   a second adhesive material of substantially uniform thickness;
   an optical transmitter arranged on the second adhesive material, wherein the first adhesive material and the second adhesive material provide electrical isolation between the optical receiver and the optical transmitter, which are operating at a voltage difference of at least 2.5 kV; and
   a second dielectric layer sandwiched between the optical transmitter and the second adhesive material.

10. The opto-coupler of claim 9, wherein the first adhesive material comprises a transparent epoxy material.

11. The opto-coupler of claim 9, wherein the first adhesive material comprises tape.

12. The opto-coupler of claim 9, further comprising a lead frame having a first set of leads and a second set of leads, wherein the optical receiver is electrically connected to the first set of leads, wherein the optical transmitter is electrically connected to the second set of leads, and wherein the first and second adhesive materials provide electrical isolation between the first set of leads and the second set of leads.

13. The opto-coupler of claim 9, wherein the optical receiver comprises at least one of a photo-diode and phototransistor.

14. The opto-coupler of claim 9, wherein the opto-coupler is a multi-channel opto-coupler.

15. A method of manufacturing an opto-isolator, comprising:
   providing a substrate;
   connecting an optical receiver to a first set of electrical leads operating at a first voltage;
   disposing the optical receiver on the substrate;
   providing a first adhesive material on the optical receiver;
   providing a lens assembly on the first adhesive material;
   providing a first dielectric layer between the lens assembly and the optical receiver;
   providing a second adhesive material on the lens assembly;
   disposing an optical transmitter on the second adhesive material;
   providing a second dielectric layer between the lens assembly and the optical transmitter;
   connecting the optical transmitter to a second set of electrical leads operating at a second voltage that is different from the first voltage by at least 2.5 kV;
   using the first dielectric layer, the first adhesive material, the lens assembly, the second dielectric layer, and the second adhesive material to provide an electrical isolation between the first set of leads and the second set of leads; and
   providing an encapsulant around the substrate, optical receiver, first adhesive material, lens assembly, second adhesive material, and optical transmitter.

16. The method of claim 15, wherein the lens assembly comprises at least two lenses.

17. The method of claim 15, wherein at least one of the first adhesive material and second adhesive material comprises tape.

18. The method of claim 15, wherein the opto-coupler is a multi-channel opto-coupler.

19. The method of claim 15, wherein the optical receiver comprises at least one of a photo-diode and photo-transistor.

20. The method of claim 15, wherein the first adhesive material comprises a transparent epoxy material.

* * * * *